(12) United States Patent
Saito

(10) Patent No.: US 9,209,807 B2
(45) Date of Patent: Dec. 8, 2015

(54) DIFFERENTIAL RECEIVER, ELECTRONIC DEVICE AND INDUSTRIAL DEVICE INCLUDING THE SAME, AND METHOD OF RECEIVING DIFFERENTIAL SIGNAL

(71) Applicant: ROHM CO., LTD., Kyoto (JP)

(72) Inventor: Shinichi Saito, Kyoto (JP)

(73) Assignee: ROHM CO., LTD. (JP)

( * ) Notice: Subject to any disclaimer, the term of this patent is extended or adjusted under 35 U.S.C. 154(b) by 0 days.

(21) Appl. No.: 14/312,828

(22) Filed: Jun. 24, 2014

(65) Prior Publication Data

US 2014/0375355 A1    Dec. 25, 2014

(30) Foreign Application Priority Data

Jun. 25, 2013   (JP) ................. 2013-133091

(51) Int. Cl.
   *H03K 19/003*     (2006.01)
   *H03K 19/00*      (2006.01)

(52) U.S. Cl.
   CPC ...... *H03K 19/00361* (2013.01); *H03K 19/0016* (2013.01)

(58) Field of Classification Search
   CPC ............... H03K 19/0016; H03K 19/00361; G11C 5/147
   USPC ........... 326/34, 21, 82, 86, 87, 68; 327/74, 77
   See application file for complete search history.

(56) References Cited

U.S. PATENT DOCUMENTS

| | | | |
|---|---|---|---|
| 4,380,080 A * | 4/1983 | Rattlingourd | 375/289 |
| 6,208,187 B1 * | 3/2001 | Callahan, Jr. | 327/206 |
| 6,320,406 B1 * | 11/2001 | Morgan et al. | 326/14 |
| 6,437,606 B1 * | 8/2002 | Ranieri et al. | 327/74 |
| 6,614,271 B1 * | 9/2003 | Jin et al. | 327/77 |
| 6,650,149 B1 * | 11/2003 | Wong | 327/65 |
| 6,894,536 B2 * | 5/2005 | Martin et al. | 326/63 |
| 2009/0295451 A1 * | 12/2009 | Jordanger et al. | 327/333 |

* cited by examiner

*Primary Examiner* — Dylan White
(74) *Attorney, Agent, or Firm* — Cantor Colburn LLP

(57) ABSTRACT

A differential receiver for receiving differential signals including a positive signal and a negative signal and generating an output signal is provided. The differential receiver includes a first comparator configured to compare the positive signal and the negative signal and generate a first signal that is asserted when a difference between the positive signal and the negative signal is larger than a positive offset voltage; a second comparator configured to compare the positive signal and the negative signal and generate a second signal that is asserted when the difference between the positive signal and the negative signal is smaller than a negative offset voltage; a logic gate configured to generate a third signal that is asserted when the first signal and the second signal are negated; and an output circuit configured to generate the output signal based on the first to third signals.

19 Claims, 12 Drawing Sheets

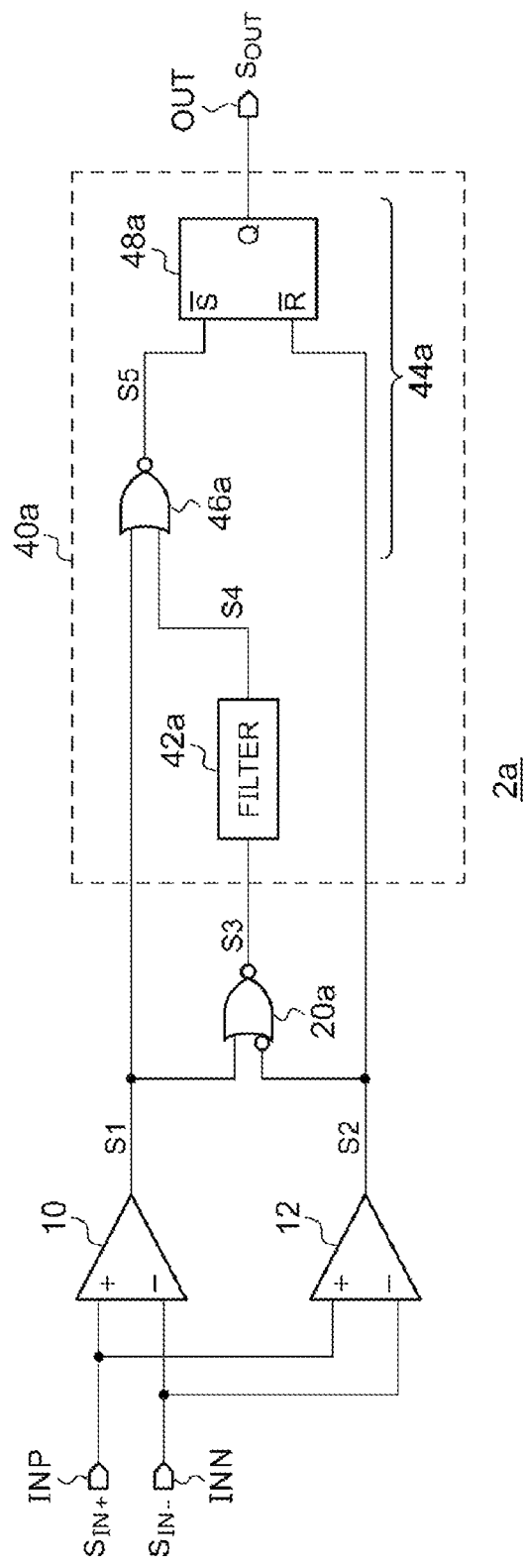

42a

48a

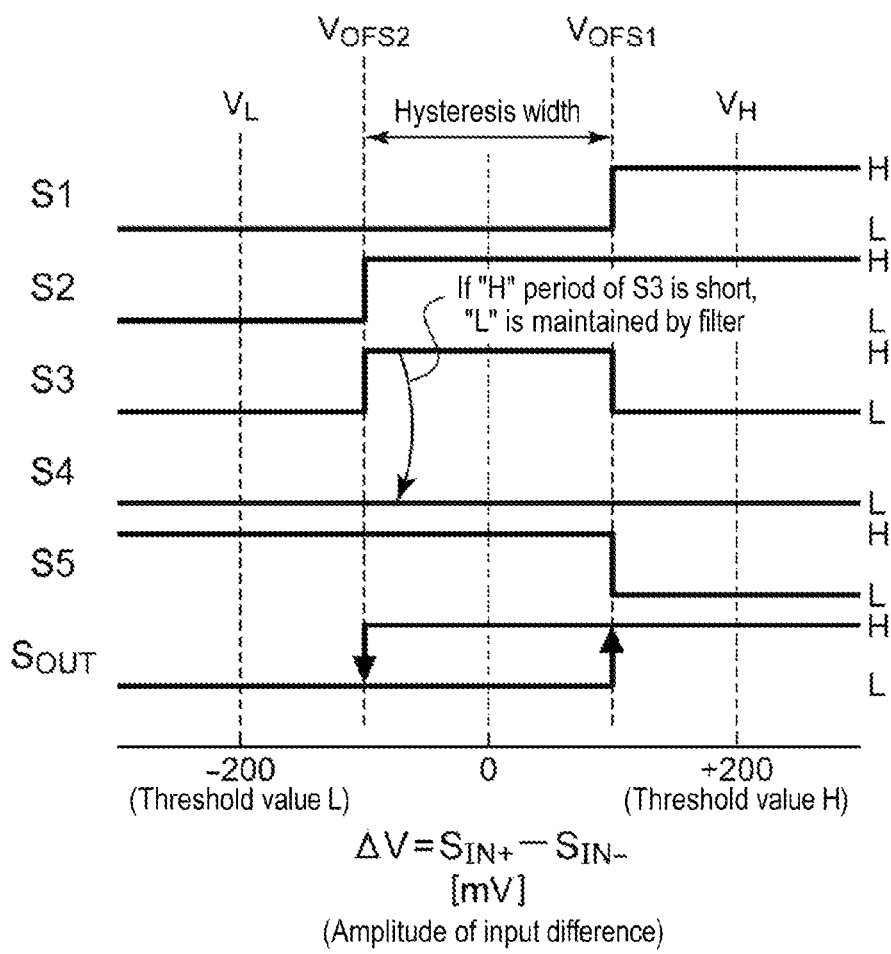

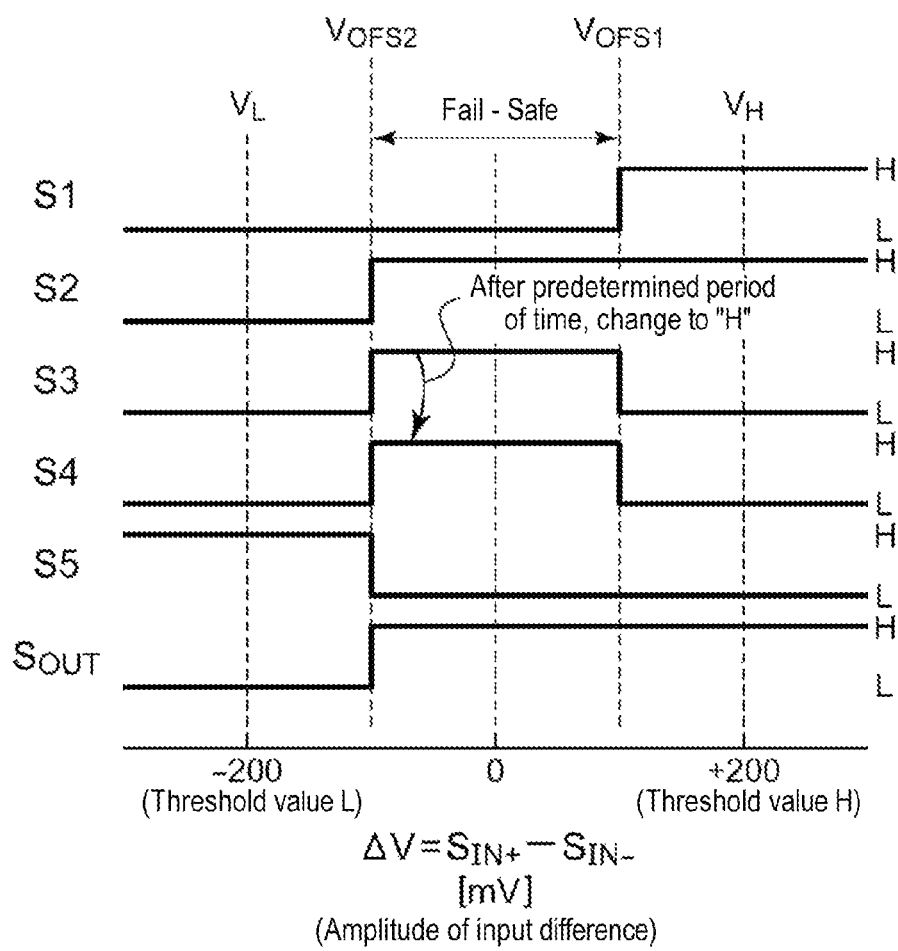

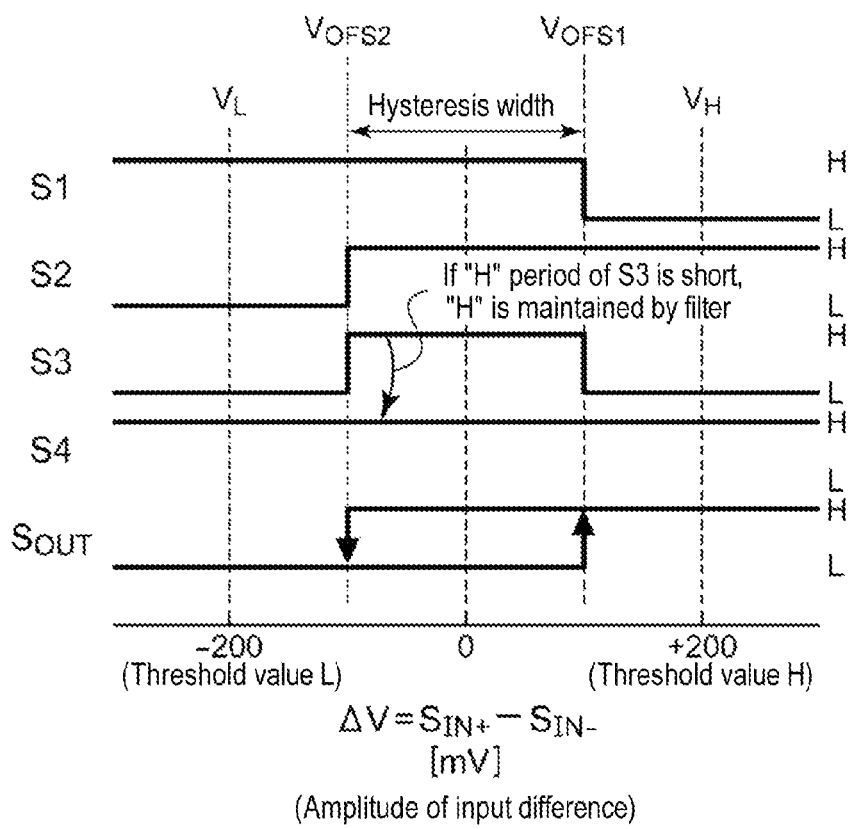

500

600

DIFFERENTIAL RECEIVER, ELECTRONIC DEVICE AND INDUSTRIAL DEVICE INCLUDING THE SAME, AND METHOD OF RECEIVING DIFFERENTIAL SIGNAL

CROSS-REFERENCE TO RELATED APPLICATION

This application is based upon and claims the benefit of priority from Japanese Patent Application No. 2013-133091, filed on Jun. 25, 2013, the entire contents of which are incorporated herein by reference.

TECHNICAL FIELD

The present disclosure relates to a differential receiver.

BACKGROUND

Communication methods using a differential signal, for example, the RS485 standard, the RS422 standard, the LVDS (Low Voltage Differential Signaling) standard, and the like have been proposed as standards for high-speed serial transmission of digital signals.

FIG. 1A illustrates a circuit diagram of a conventional differential receiver, and FIGS. 1B and 1C illustrate examples for input-output characteristics of the differential receiver. Referring to FIG. 1A, a differential receiver $2r$ is configured to receive differential signals $S_{IN+}$ and $S_{IN-}$ that are inputted to input terminals INP and INN, respectively, and generate an output signal $S_{OUT}$ based on a magnitude relationship between a amplitude of a difference $\Delta V$ (=$S_{IN+}-S_{IN-}$) and a predetermined threshold value $V_{TH}$. Specifically, the differential receiver $2r$ is required to output a high level signal if $\Delta V > V_H$ and a low level signal if $\Delta V < V_L$. Here, $V_H$ indicates a positive voltage and $V_L$ indicates a negative voltage. For example, these voltages are 200 mV and -200 mV, respectively.

The basic configuration and operation of the differential receiver $2r$ of FIG. 1A will be described below. The differential receiver $2r$ includes a comparator $10r$. The comparator $10r$ outputs a high level signal if $S_{IN+}>S_{IN-}$ and a low level signal if $S_{IN+}<S_{IN-}$. That is, the comparator 10 compares the amplitude of the difference $\Delta V$ (=$S_{IN+}-S_{IN-}$) with the threshold voltage $V_{TH}$. In this case, if the threshold value $V_{TH}$ is fixed at 0V, chattering may occur due to noises. Thus, as shown in FIG. 1B, a hysteresis is set for the comparator $10r$ and the threshold voltage $V_{TH}$ switches between two values, i.e., $V_{THL}$ and $V_{THH}$.

With the above configurations, a failure of short circuit may occur between wires of differential lines connected to the differential receiver $2r$ (which may be referred to as a short-circuit failure), and thus, it may be required to detect the failure in the differential receiver $2r$.

Thus, to detect the short-circuit failure, a method of offsetting the centers of the threshold voltages $V_{THL}$ and $V_{THH}$ as illustrated in FIG. 1C may be considered. In this method, the output of the comparator $10r$ can be fixed at a high level when a condition in which the differential wires are short-circuited to make $S_{IN+}$ and $S_{IN-}$ equal to each other is maintained, thereby allowing the short-circuit failure to be detected.

Further, in the above configuration, a termination resistor (not shown) is generally inserted between the input terminals INP and INN. Accordingly, if a wire disconnection failure (e.g., an open failure) occurs or a transmission side is in an off state (e.g., a high impedance), the termination resistor causes the amplitude of the difference $\Delta V$ to become zero. As such, the differential receiver $2r$ of FIG. 1A can detect the open failure and the off state of the transmission circuit.

However, if an offset is introduced for the short-circuit failure as shown in FIG. 1C, it is necessary to reduce a hysteresis width as compared to that in FIG. 1B, which may result in lower noise resistance.

SUMMARY

The present disclosure provides some embodiments of a differential receiver which is capable of detecting failure while maintaining a wide hysteresis width or taking a wide reception margin.

According to one embodiment of the present disclosure, a differential receiver for receiving differential signals including a positive signal and a negative signal and generating an output signal may include a first comparator, which has a positive offset voltage, configured to compare the positive signal and the negative signal and generate a first signal that is asserted when a difference between the positive signal and the negative signal is larger than the positive offset voltage; a second comparator, which has a negative offset voltage, configured to compare the positive signal and the negative signal and generate a second signal that is asserted when the difference between the positive signal and the negative signal is smaller than the negative offset voltage; a logic gate configured to generate a third signal that is asserted when the first signal and the second signal are negated; and an output circuit configured to generate the output signal based on the first to third signals.

In one embodiment, the output circuit may be configured to set the output signal to a first level when the first signal or the third signal is asserted, and a second level when the second signal is asserted.

In one embodiment, the output circuit may be configured to set the output signal to the first level when the first signal is asserted or when a condition in which the third signal is asserted is maintained for a predetermined period of time.

In one embodiment, the output circuit may include a filter configured to generate a fourth signal by filtering the third signal; and a logic part configured to generate the output signal based on the first signal, the second signal, and the fourth signal.

In one embodiment, the positive signal may be inputted to a non-inverted input terminal of the first comparator and the negative signal may be inputted to an inverted input terminal of the first comparator. In this embodiment, the positive signal may be inputted to a non-inverted input terminal of the second comparator and the negative signal is inputted to an inverted input terminal of the second comparator, and the logic gate may include a first NOR gate which has a positive-logic input terminal for receiving the first signal and a negative-logic input terminal for receiving the second signal, and output the third signal.

In one embodiment, the output circuit may include a filter configured to receive the third signal and generate a fourth signal of a high level when the third signal is maintained at a high level for a predetermined period of time; and a logic part configured to set the output signal to a first level when the first signal or the fourth signal is of a high level and set the output signal to a second level when the second signal is of a low level.

In one embodiment, the logic part may include a second NOR gate which has a positive-logic input terminal for receiving the first signal and a positive-logic input terminal for receiving the fourth signal, and generates a fifth signal; and an SR latch which has a negative-logic set terminal for receiving the fifth signal and a negative-logic reset terminal for receiving the second signal, and output the output signal.

In one embodiment, the filter may include a multi-stage delay circuit which has a plurality of delay elements connected in series, the third signal being inputted to an initial stage of the multi-stage delay circuit; and an AND gate which generates a logical product of the third signal and outputs of the plurality of delay elements.

In one embodiment, each of the delay elements may include a first PMOS transistor, a first resistor, and a first NMOS transistor which are connected in series between a power line and a ground line; a second PMOS transistor, a second resistor, and a second NMOS transistor which are connected in series between the power line and the ground line; a first capacitor connected between the ground line and a connection point of the first PMOS transistor and the first resistor; and a second capacitor connected between the ground line and a connection point of the second resistor and the second NMOS transistor. In this embodiment, gates of the first PMOS transistor and the first NMOS transistor may receive an input signal, and gates of the second PMOS transistor and the second NMOS transistor may be connected to the connection point of the first PMOS transistor and the first resistor.

In one embodiment, the positive signal may be inputted to a non-inverted input terminal of the first comparator and the negative signal is inputted to an inverted input terminal of the first comparator. In this embodiment, the positive signal may be inputted to a non-inverted input terminal of the second comparator and the negative signal is inputted to an inverted input terminal of the second comparator, and the logic gate may include an AND gate which has a positive-logic first input terminal for receiving the first signal and a positive-logic second input terminal for receiving the second signal, and output the third signal.

In one embodiment, the output circuit may include a filter configured to receive the third signal and generate a fourth signal of a high level when the third signal is maintained at a high level for a predetermined period of time; and a logic part configured to set the output signal to a first level when the first signal or the fourth signal is of a low level and set the output signal to a second level when the second signal is of the low level.

In one embodiment, the logic part may include an SR latch which has a negative-logic set terminal for receiving the first signal, a negative-logic second set terminal for receiving the fourth signal, and a negative-logic reset terminal for receiving the second signal, and outputs the output signal.

In one embodiment, the filter may include a multi-stage delay circuit which has a plurality of delay elements connected in series, the third signal being inputted to an initial stage of the multi-stage delay circuit; and a NAND gate which generates a logical product of the third signal and outputs of the plurality of delay elements.

In one embodiment, each of the delay elements may include a first PMOS transistor, a first resistor, and a first NMOS transistor which are connected in series between a power line and a ground line; a second PMOS transistor, a second resistor, and a second NMOS transistor which are connected in series between the power line and the ground line; a first capacitor connected between the ground line and a connection point of the first PMOS transistor and the first resistor; and a second capacitor connected between the ground line and a connection point of the second resistor and the second NMOS transistor. In this embodiment, gates of the first PMOS transistor and the first NMOS transistor may receive an input signal, and gates of the second PMOS transistor and the second NMOS transistor may be connected to the connection point of the first PMOS transistor and the first resistor.

In one embodiment, each of the first comparator and the second comparator may include a differential amplifier provided at an input terminal of the comparator and the differential amplifier may include an offset resistor inserted in one side of an input differential pair of the differential amplifier.

In one embodiment, the output circuit may be configured to set the output signal to a first level when the first signal is asserted and a second level when the second signal or the third signal is asserted.

In one embodiment, the output circuit may be configured to set the output signal to the second level when the second signal is asserted or when a condition in which the third signal is asserted is maintained for a predetermined period of time.

According to another embodiment of the present disclosure, an industrial device including the differential receiver is disclosed.

According to another embodiment of the present disclosure, an electronic device including the differential receiver is disclosed.

According to another embodiment of the present disclosure, a differential receiver for receiving differential signals including a positive signal and a negative signal and generating an output signal may include a window comparator configured to compare a difference between the positive signal and the negative signal with a positive upper threshold voltage and a negative lower threshold voltage; and an output circuit configured to set the output signal to: a first level when an output of the window comparator indicates that the difference is larger than the upper threshold voltage; a second level when the output of the window comparator indicates that the difference is smaller than the lower threshold voltage; and the first level when the output of the window comparator indicates that a condition in which the difference is larger than the lower threshold voltage and is smaller than the upper threshold voltage is maintained for a predetermined period of time.

According to another embodiment of the present disclosure, a method of receiving differential signals including a positive signal and a negative signal may include by a first comparator, which has a positive offset voltage, configured to compare the positive signal and the negative signal, generating a first signal that is asserted when a difference between the positive signal and the negative signal is larger than the positive offset voltage; by a second comparator, which has a negative offset voltage, configured to compare the positive signal and the negative signal, generating a second signal that is asserted when the difference between the positive signal and the negative signal is smaller than the negative offset voltage; generating a third signal that is asserted when the first signal and the second signal are negated; and generating an output signal based on the first to third signals.

Other aspects of the present disclosure may include any combinations of the above-described elements or conversion of expression of the present disclosure between methods, apparatuses, and so on.

BRIEF DESCRIPTION OF THE DRAWINGS

FIGS. 3A to 3C illustrate circuit diagrams of a differential receiver according to a first embodiment example of the present disclosure.

FIGS. 4A and 4B illustrate operations of the differential receiver according to the first embodiment example of the present disclosure.

FIGS. 6A and 6B illustrate operations of the differential receiver according to the second embodiment example of the present disclosure.

DETAILED DESCRIPTION

Figure 1A:
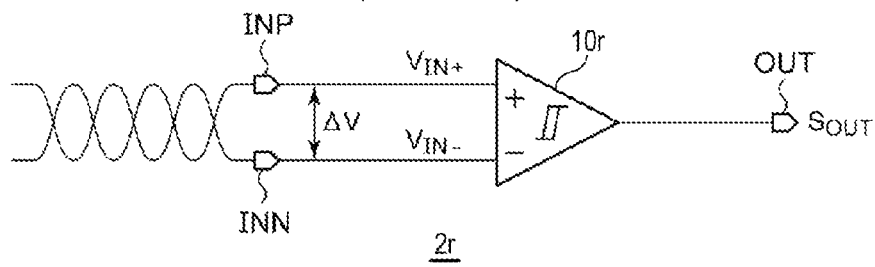
FIG. 1A illustrates a circuit diagram of a conventional differential receiver
Figure 1B:
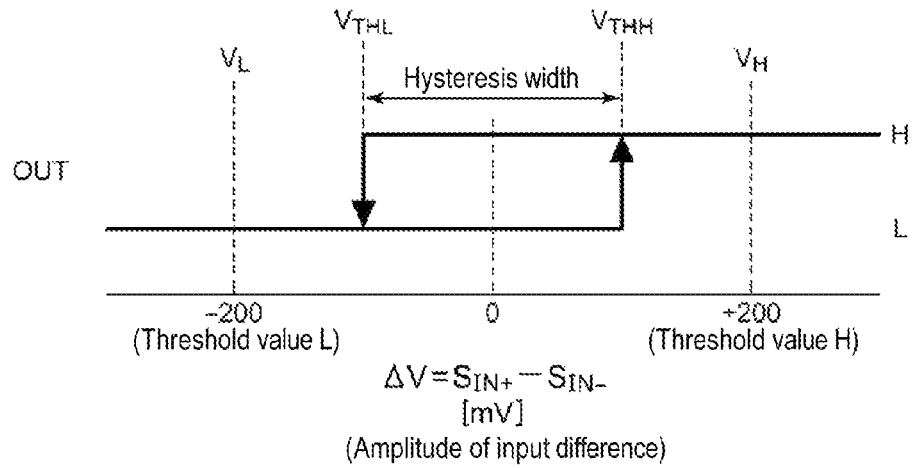
FIG. 1B illustrates an example for input-output characteristics of the conventional differential receiver.

Various embodiments of the present disclosure are described below in detail with reference to the accompanying drawings. Throughout the drawings, the same or similar elements, members, and processes are denoted by the same reference numerals and explanation of which may be omitted. The disclosed embodiments are provided for the purpose of illustration, not limited thereto, of the present disclosure, and all features and combinations thereof described in the embodiments cannot be necessarily construed to describe the spirit of the present disclosure.

As used herein, the phrase "a state where a member A is connected with a member B" may include a case where the member A is physically and directly connected with the member B, and a case where the member A is connected with the member B via another member which has no effect on a state of electrical connection. Similarly, the phrase "a state where a member C is interposed between a member A and a member B" may include a case where the member A is directly connected with the member C or the member B is directly connected with the member C, and a case where the members are indirectly connected via another member which has no effect on a state of electrical connection.

Figure 2:
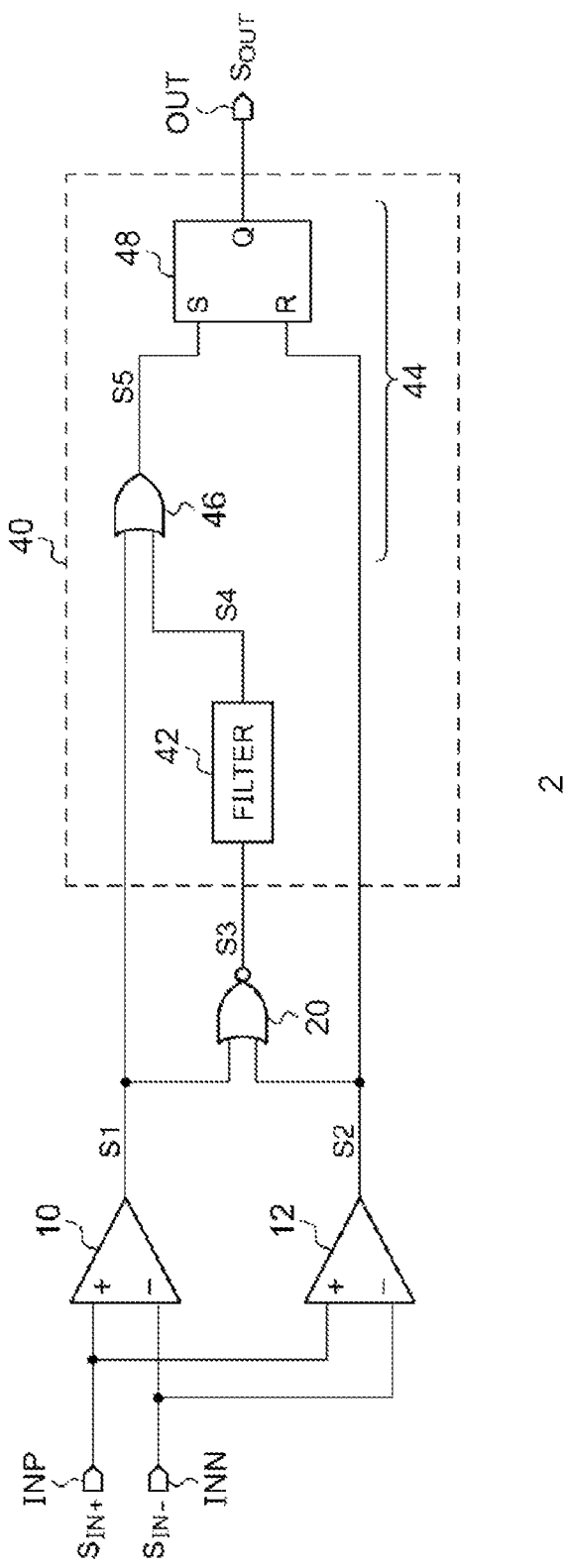
FIG. 2 illustrates a circuit diagram for a configuration of a differential receiver according to one embodiment of the present disclosure.

FIG. 2 illustrates a circuit diagram for a configuration of a differential receiver 2 according to one embodiment of the present disclosure. The differential receiver 2 includes a first input terminal INP, a second input terminal INN, and an output terminal OUT. Differential signals including a positive signal $S_{IN+}$ and a negative signal $S_{IN-}$ are inputted to the first input terminal INP and the second input terminal INN, respectively. The differential receiver 2 further includes a first comparator 10, a second comparator 12, a logic gate 20, and an output circuit 40.

The first comparator 10 is configured to have a positive offset voltage $V_{OFS1}$, compare the positive signal $S_{IN+}$ and the negative signal $S_{IN-}$, and output a first signal S1 indicating a result of the comparison. The first comparator 10 may assert the first signal S1 when a difference $\Delta V$ ($=S_{IN+}-S_{IN-}$) between the positive signal $S_{IN+}$ and the negative signal $S_{IN-}$ is larger than the positive offset voltage $V_{OFS1}$.

In the differential receiver 2 of FIG. 2, the positive signal $S_{IN+}$ and the negative signal $S_{IN-}$ are inputted to a non-inverted input terminal (+) and an inverted input terminal (−) of the first comparator 10, respectively. As such, the asserted first signal S1 is assigned a high level.

The second comparator 12 is configured to have a negative offset voltage $V_{OFS2}$, compare the positive signal $S_{IN+}$ and the negative signal $S_{IN-}$, and output a second signal S2 indicating a result of the comparison. The second comparator 12 may assert the second signal S2 when the difference $\Delta V$ ($=S_{IN+}-S_{IN-}$) between the positive signal $S_{IN+}$ and the negative signal $S_{IN-}$ is smaller than the negative offset voltage $V_{OFS2}$.

The negative signal $S_{IN-}$ and the positive signal $S_{IN+}$ are inputted to a non-inverted input terminal (+) and an inverted input terminal (−) of the second comparator 12, respectively. As such, the assertion of the second signal S2 is assigned a high level.

The logic gate 20 generates a third signal S3 which is asserted when the first signal S1 and the second signal S2 are both negated, that is to say, when $V_{OFS2}<\Delta V<V_{OFS1}$. For example, the logic gate 20 may include a NOR gate.

The output circuit 40 generates an output signal $S_{OUT}$ based on the first to third signals S1 to S3.

Specifically, (i) when the first signal S1 or the third signal S3 is asserted, the output circuit 40 sets the output signal $S_{OUT}$ to a first level (hereinafter, referred to as a high level). In other words, when $V_{OFS1}<\Delta V$, the output signal $S_{OUT}$ is set to the high level. In addition, (ii) when the second signal S2 is asserted, the output circuit 40 sets the output signal $S_{OUT}$ to a second level (hereinafter, referred to as a low level). In other words, when $\Delta V<V_{OFS2}$, the output signal $S_{OUT}$ is set to the low level.

More specifically, when the first signal S1 is asserted or when a condition where the third signal S3 is asserted is maintained for a predetermined period of time, the output circuit 40 may set the output signal $S_{OUT}$ to the first level (i.e., the high level).

For example, the output circuit 40 includes a filter 42 and a logic part 44. The filter 42 generates a fourth signal S4 by filtering the third signal S3. The filter 42 asserts the fourth signal S4 when the condition where the third signal S3 is asserted is maintained for a predetermined period of time τ.

The logic part 44 sets the output signal $S_{OUT}$ to the first level when the first signal S1 or the fourth signal S4 is asserted, while it sets the output signal $S_{OUT}$ to the second level when the second signal S2 is asserted.

For example, the logic part 44 includes an OR gate 46 and an SR latch 48. The OR gate 46 generates a fifth signal S5 corresponding to a logical disjunction of the first signal S1 and the fourth signal S4. The SR latch 48 has a positive-logic set terminal for receiving the fifth signal S5 and a positive-logic reset terminal for receiving the second signal S2, and outputs the output signal $S_{OUT}$.

The basic configuration of the differential receiver 2 has been described in the above. In some cases, the logic levels of the logic gates in the differential receiver 2 of FIG. 2 may not be necessarily suitable for implementation. Thus, other examples of the configuration of the differential receiver 2, which may be suitable for implementation in some cases, will be described below.

First Embodiment Example

Figure 3B:
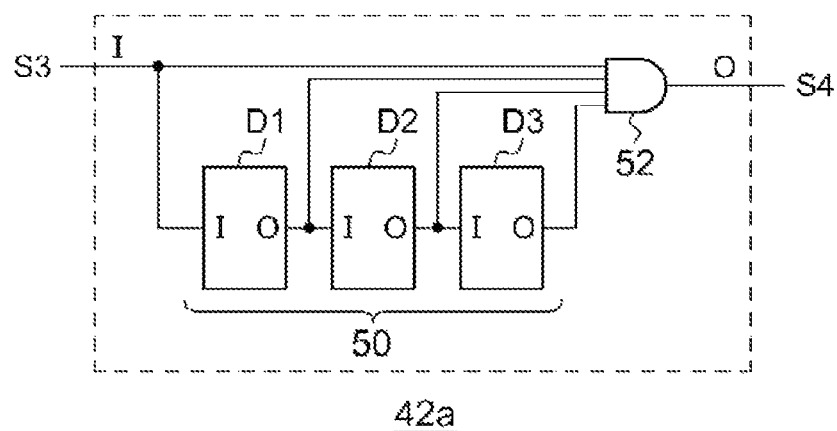
Figure 3C:
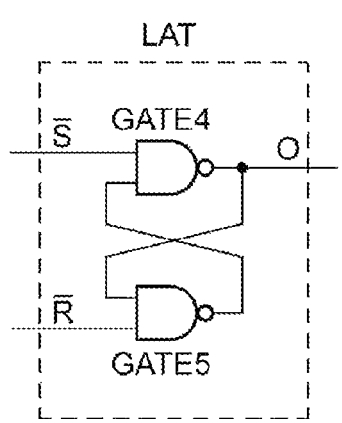

FIGS. 3A to 3C illustrate circuit diagrams for a differential receiver 2a according to a first embodiment example of the present disclosure. In the differential receiver 2a, a positive signal $S_{IN+}$ and a negative signal $S_{IN-}$ are inputted to a non-inverted input terminal (+) and an inverted input terminal (−) of a first comparator 10, respectively. In addition, the positive signal $S_{IN+}$ and the negative signal $S_{IN-}$ are also inputted to a non-inverted input terminal (+) and an inverted input terminal (−) of a second comparator 12, respectively. In this embodiment example, the asserted first signal S1 is assigned a high level and the asserted second signal S2 is assigned a low level.

A logic gate 20a includes a first NOR gate, which includes a positive-logic first input terminal for receiving the first signal S1 and a negative-logic second input terminal for receiving the second signal S2, and outputs a third signal S3.

A first filter 42a receives the third signal S3 and generates a fourth signal S4 when the third signal S3 is maintained at a high level for a predetermined period of time. A first logic part 44a sets an output signal $S_{OUT}$ to a first level when the first signal S1 or the fourth signal S4 is of the high level, while it sets the output signal $S_{OUT}$ to the second level when the second signal S2 is of the high level.

The first logic part 44a includes a second NOR gate 46a and a first SR latch 48a. The second NOR gate 46a has a positive-logic first input terminal for receiving the first signal S1 and a positive-logic second input terminal for receiving the fourth signal S4, and generates a fifth signal S5. The first SR latch 48a has a negative-logic set terminal for receiving the fifth signal S5 and a negative-logic reset terminal for receiving the second signal S2, and outputs the output signal $S_{OUT}$. The first SR latch 48a has set priority logic.

FIGS. 3B and 3C illustrate specific examples of a configuration of the first filter 42a and the first SR latch 48a, respectively. As illustrated in FIG. 3B, the first filter 42a may include a multi-stage delay circuit 50 and a first AND gate 52. The multi-stage delay circuit 50 includes a plurality of delay elements D1 to D3 which are connected in series, and the third signal S3 is inputted to a first stage (i.e., the delay element DD. The first AND gate 52 generates the fourth signal S4 corresponding to a logical product of the third signal S3 and outputs of the delay elements D1 to D3. As illustrated in FIG. 3C, the first SR latch 48a may include two NAND gates GATE4 and GATE5 which are connected crosswise.

The configuration of the differential receiver 2a is described above. Next, operations of the differential receiver 2a will be described below. FIGS. 4A and 4B illustrate operations of the differential receiver 2a according to the first embodiment example of the present disclosure. FIG. 4A illustrates an operation when the differential receiver 2a receives the differential signals $S_{IN+}$ and $S_{IN-}$ normally without causing a short-circuit failure, and FIG. 4B illustrates an operation when a short-circuit failure occurs.

Referring to FIG. 4A, if no short-circuit failure occurs, ΔV is larger than $V_H$ when data carried on the differential signals is "1," while ΔV is smaller than $V_L$ when the data is "0". The first signal S1 is asserted (i.e., a high level) when $ΔV>V_H$, while the second signal S2 is asserted (i.e., a low level) when $ΔV<V_L$. Under an assumption that the differential signals swing, although an amplitude of the difference ΔV may have a relationship of $V_{OFS2}<ΔV<V_{OFS1}$ in a short time, the fourth signal S4 is not asserted because a duration for which the above relationship is maintained is shorter than the period of time t which is set for the filter 42.

As a result, when $ΔV>V_{OFS1}$, the SR latch 48 is set and the output signal $S_{OUT}$ is assigned a high level, while when $ΔV<V_{OFS2}$, the SR latch 48 is reset and the output signal $S_{OUT}$ is assigned a low level. Thus, the differential receiver 2a is capable of receiving the differential signals with a hysteresis width of $V_{OFS1}-V_{OFS2}$ with a center at 0V.

Referring to FIG. 4B, if a short-circuit failure occurs, ΔV may fall down to substantially zero to provide a relationship of $V_{OFS2}<ΔV<V_{OFS1}$. Accordingly, assertion of the third signal S3 is maintained, and thus, the fourth signal S4 is asserted.

Thus, within a range of $V_{OFS2}<ΔV$, the output signal $S_{OUT}$ maintained at a first level (i.e., a high level), thereby allowing detection of a short-circuit failure.

In addition, in the differential receiver 2a, if a termination resistor (not shown) is inserted between the input terminals INP and INN, the termination resistor may cause the amplitude of the difference ΔV to become zero in an open failure or an off state of a transmission circuit. Therefore, the differential receiver 2a can detect the open failure and the off state of the transmission circuit.

The operation of the differential receiver 2a is described above. With this differential receiver 2a, it is possible to detect the short-circuit failure while widening a hysteresis width as compared to the conventional technology illustrated in FIG. 1C. In addition, noise resistance can be improved by increasing the hysteresis width.

Alternatively, the absolute values of the offset voltages $V_{OFS1}$ and $V_{OFS2}$ may be set to be small so that a wide margin can be taken although the hysteresis width is small.

Figure 1C:
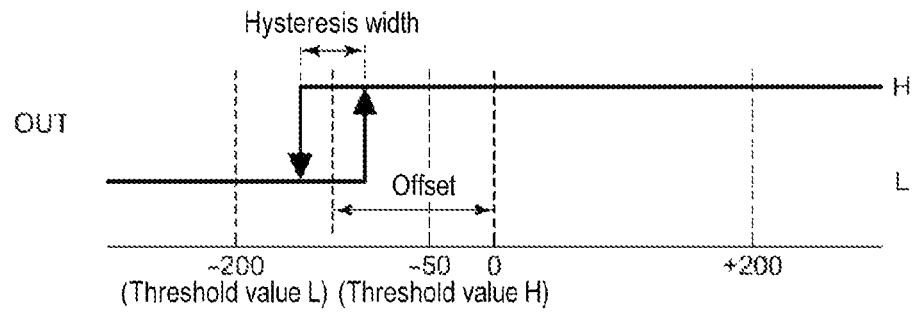
FIG. 1C illustrates another example for input-output characteristics of the conventional differential receiver.

In FIG. 1C, since a level of the threshold value is biased to a negative voltage, a duty cycle of the output signal of the differential receiver may be larger (or smaller) than 50%. By contrast, with the differential receiver 2a, since the center levels of the threshold voltages $V_{OFS1}$ and $V_{OFS2}$ can be set at or near 0V, as shown in FIGS. 4A and 4B, it is possible to approach the duty cycle of the output signal $S_{OUT}$ to 50%.

Second Embodiment Example

Figure 5A:
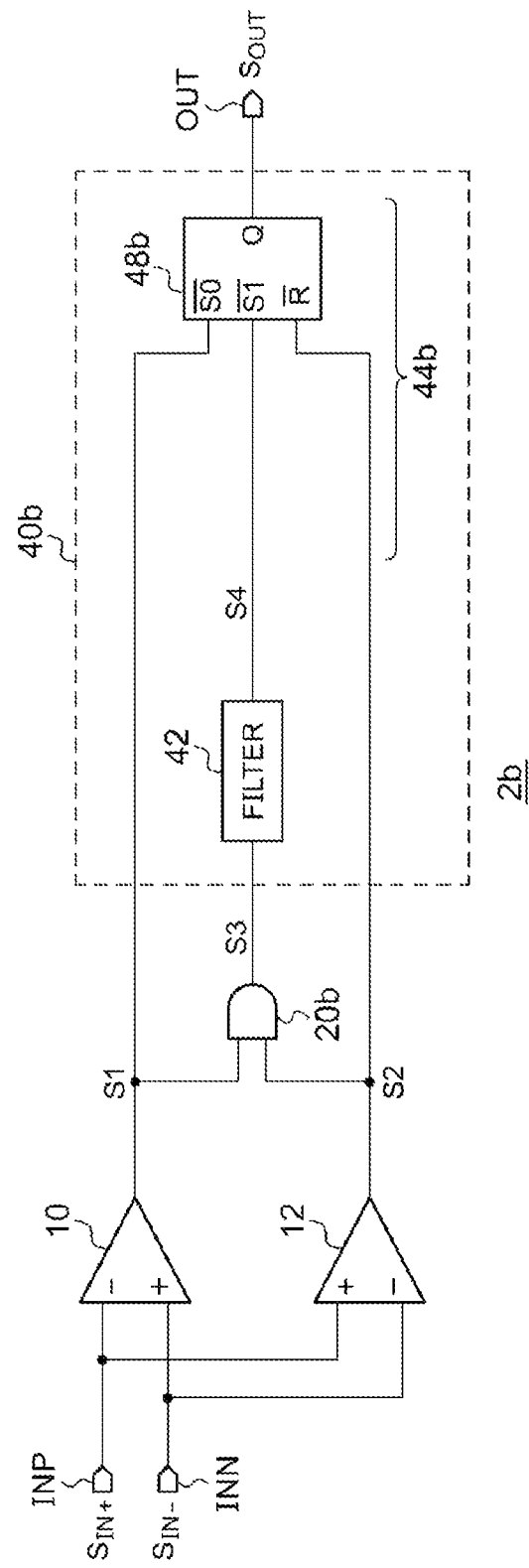
FIGS. 5A to 5C illustrate circuit diagrams of a differential receiver according to a second embodiment example of the present disclosure.
Figure 5B:
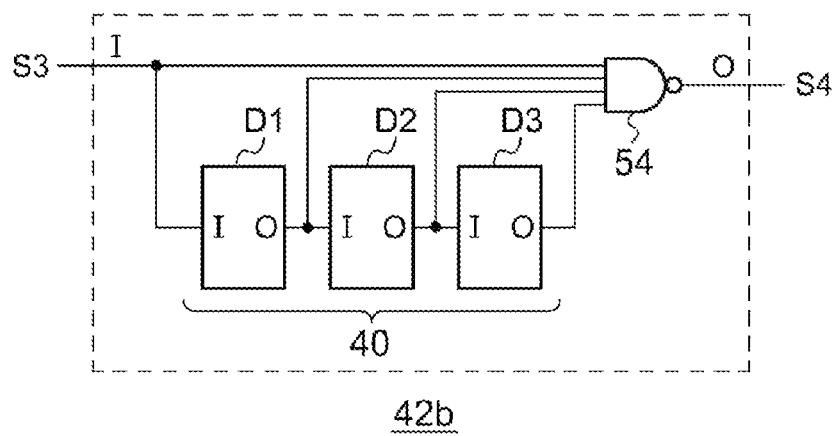
Figure 5C:
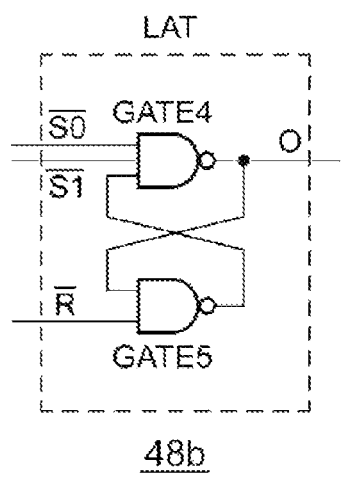

FIGS. 5A to 5C illustrate circuit diagrams for a differential receiver 2b according to a second embodiment example of the present disclosure. The differential receiver 2b is different in signal logic level from the differential receiver 2a of FIG. 3A.

In the differential receiver 2b, a positive signal $S_{IN+}$ and a negative signal $S_{IN-}$ are inputted to an inverted input terminal (−) and a non-inverted input terminal (+) of a first comparator 10, respectively. The positive signal $S_{IN+}$ and the negative signal $S_{IN-}$ are inputted to a non-inverted input terminal (+) and an inverted input terminal (−) of a second comparator 12, respectively. In this embodiment example, an asserted first signal S1 is assigned a low level and an asserted second signal S2 is assigned a low level.

A logic gate 20b includes a second AND gate, which includes a positive-logic first input terminal for receiving the first signal S1 and a positive-logic second input terminal for receiving the second signal S2 and outputs a third signal S3.

An output circuit 40b includes a second filter 42b and a second logic part 44b. The second filter 42b receives the third signal S3 and generates a fourth signal S4 when the third signal S3 is maintained at a low level for a predetermined period of time.

The second logic part 44b sets an output signal $S_{OUT}$ to a first level (i.e., a high level) when the first signal S1 or the fourth signal S4 is of a low level, while it sets the output signal $S_{OUT}$ to a second level (i.e., a low level) when the second signal S2 is of a low level. The second logic part 44b includes a second SR latch 48b, which has a first negative-logic set terminal for receiving the first signal S1, a second negative-logic set terminal for receiving the fourth signal S4, and a negative-logic reset terminal for receiving the second signal S2, and outputs the output signal $S_{OUT}$ FIGS. 5B and 5C illustrate specific examples of a configuration of the second filter 42b and the second SR latch 48b, respectively. As illustrated in FIG. 5B, the second filter 42b may include a multi-stage delay circuit 50 and a first NAND gate 54. The multi-stage delay circuit 50 includes a plurality of delay elements D1 to D3 which are connected in series, and the third signal S3 is inputted to a first stage (i.e., the delay element D1). The first NAND gate 54 generates the fourth signal S4 corresponding to a logical product of the third signal S3 and outputs of the delay elements D1 to D3.

As illustrated in FIG. 5C, the second SR latch 48b may include two NAND gates GATE4 and GATE5 which are connected crosswise. The first signal S1 and the fourth signal S4 are inputted to the NAND gate GATE4.

Figure 6B:
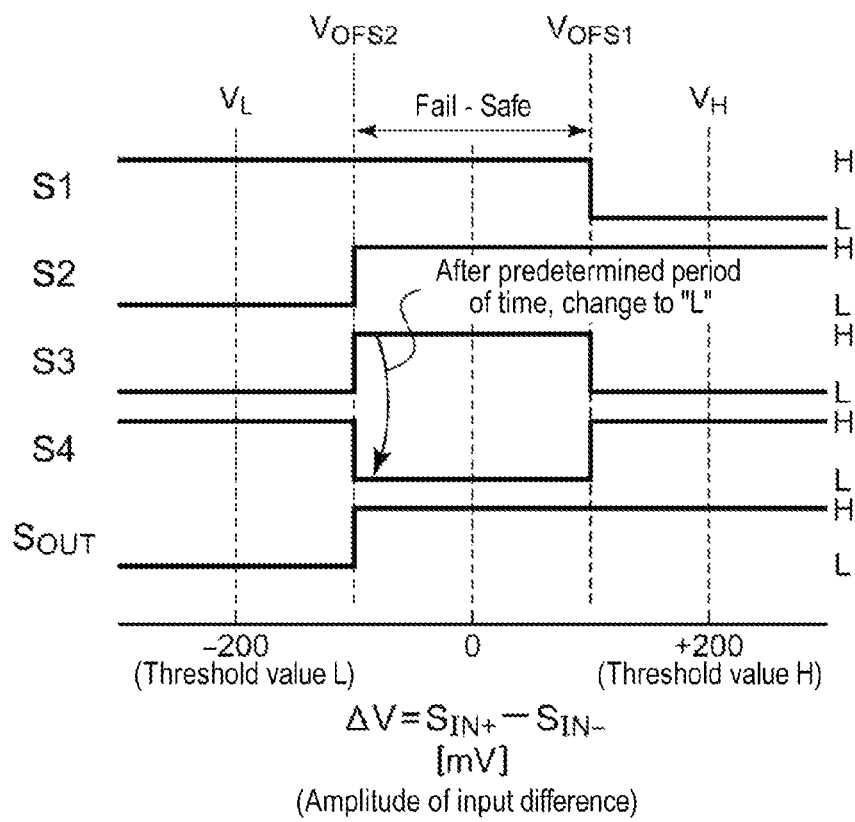

The configuration of the differential receiver 2b is described above. Next, operations of the differential receiver 2b will be described below. FIGS. 6A and 6B illustrate operations of the differential receiver 2b according to the second embodiment of the present disclosure. FIG. 6A illustrates an operation when the differential receiver 2b receives the differential signals $S_{IN+}$ and $S_{IN-}$ normally without causing a short-circuit failure and FIG. 6B shows an operation when a short-circuit failure occurs.

The differential receiver 2b essentially performs the same operations as the differential receiver 2a except for the signal logic level.

The operation of the differential receiver 2b is described above. The differential receiver 2b can achieve the same effects as those in the first embodiment example.

Figure 7A:
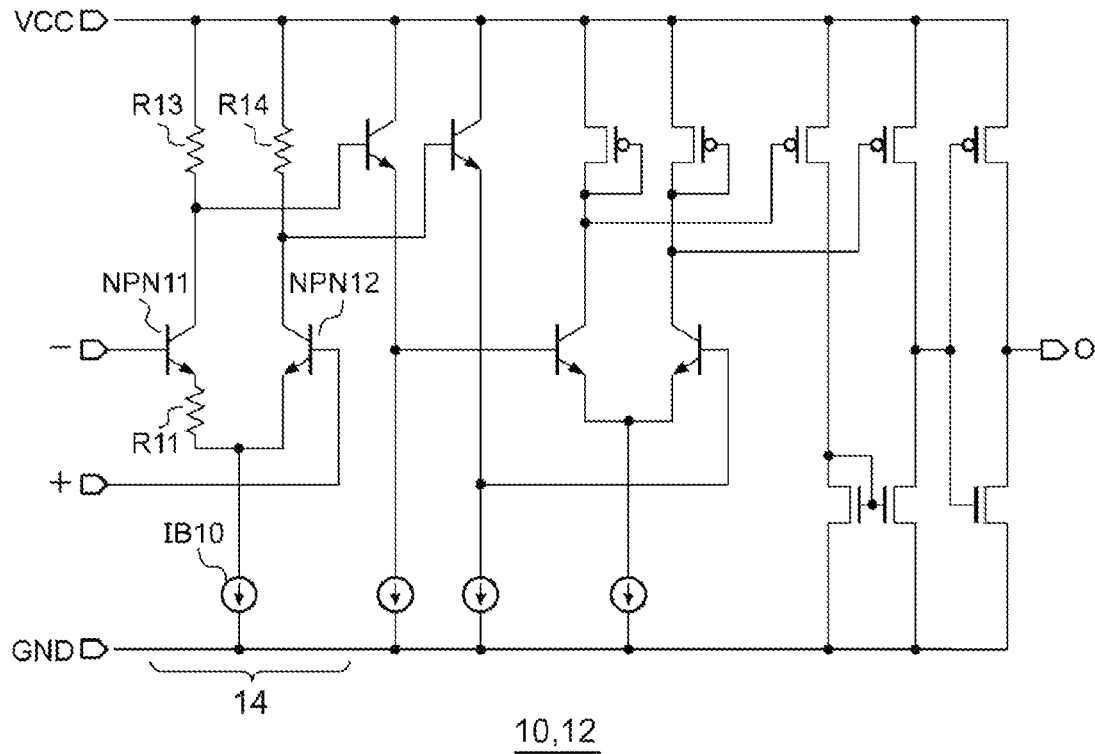
FIG. 7A illustrates a circuit diagram for a configuration example of a first comparator and a second comparator.
Figure 7B:
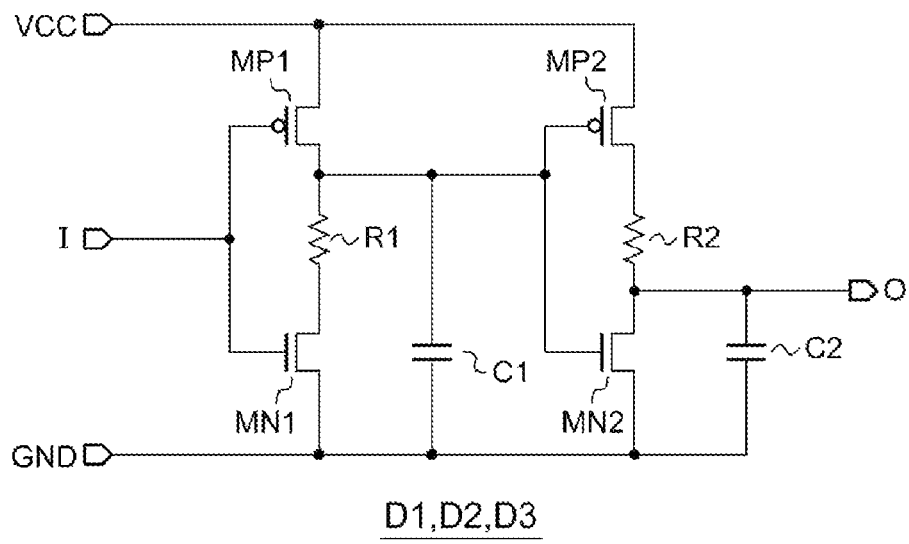
FIG. 7B illustrates a circuit diagram for a configuration example of delay elements.

FIG. 7A illustrates a circuit diagram for an example of a configuration of the first comparator 10 and the second comparator 12 and FIG. 7B illustrates a circuit diagram for an example of a configuration of the delay elements.

As illustrated in FIG. 7A, each of the first comparator 10 and the second comparator 12 includes a differential amplifier 14 which is provided at an input terminal of the comparator. The differential amplifier 14 includes an offset resistor R11 which is inserted in one side of an input differential pair NPN11 and NPN12 of the differential amplifier 14. With those configurations, it is possible to set a polarity of an offset voltage according to the side in which the offset resistor R11 is inserted and set a magnitude of the offset voltage according to a resistance of the offset resistor R11. Alternatively, the offset voltages $V_{OFS1}$ and $V_{OFS2}$ may be set by unbalancing load resistors R13 and R14 connected to the input differential pair NPN11 and NPN12. As another alternative, the offset voltages $V_{OFS1}$ and $V_{OFS2}$ may be set by unbalancing currents by connecting a current source load instead of the load resistors R13 and R14. A method of setting an offset is not particularly limited but may employ other suitable techniques known in the art.

As illustrated in FIG. 7B, each of the delay elements D1 to D3 includes a first PMOS transistor MP1, a first resistor R1, and a first NMOS transistor MN1 which are connected in series between a power line VCC and a ground line GND, and a second PMOS transistor MP2, a second resistor R2, and a second NMOS transistor MN2 which are connected in series between the power line VCC and the ground line GND. In addition, a first capacitor C1 is connected between the ground line GND and a connection point of the first PMOS transistor MP1 and the first resistor R1. A second capacitor C2 is connected between the ground line GND and a connection point of the second resistor R2 and the second NMOS transistor MN2. An input signal is inputted to gates of the first PMOS transistor MP1 and the first NMOS transistor MN1. Gates of the second PMOS transistor MP2 and the second NMOS transistor MN2 are connected to the connection point of the first PMOS transistor MP1 and the first resistor R1.

The delay element D1 can make a delay depending on a time constant of an RC filter formed by a pair of the resistor R1 and the capacitor C1 and a pair of the resistor R2 and the capacitor C2. The delay elements D1 to D3 are not particularly limited in configuration but may employ circuits known in the art.

Figure 8A:
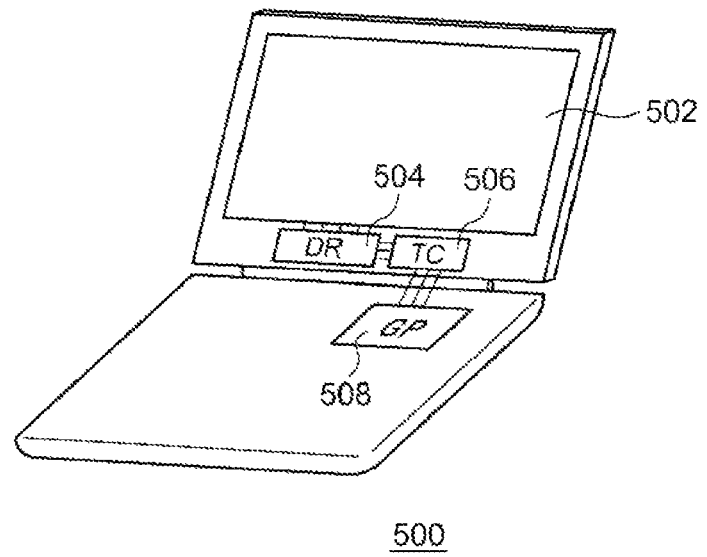
FIG. 8A illustrates a block diagram of an electronic device according to one embodiment of the present disclosure.
Figure 8B:
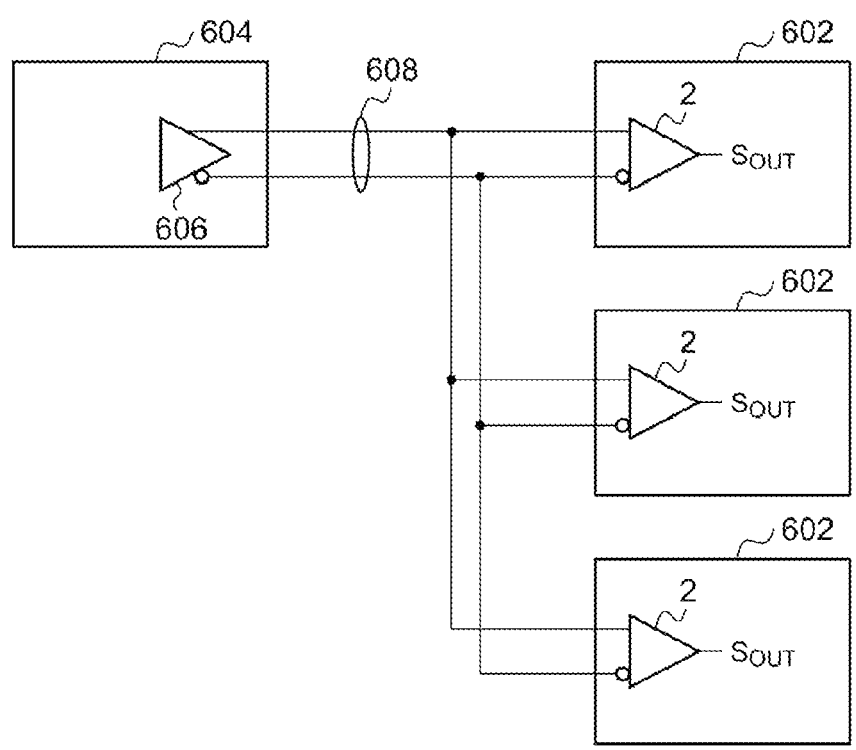
FIG. 8B illustrates a block diagram of industrial devices according to one embodiment of the present disclosure.

Use of the differential receiver 2 will be described below. FIGS. 8A and 8B illustrate block diagrams of an electronic device and industrial devices, respectively, according to one embodiment of the present disclosure.

An electronic device 500 of FIG. 8A has an interface based on the LVDS standard or the DisplayPort standard. For example, the electronic device 500 may be a notebook PC (Personal Computer), smartphone, or tablet terminal equipped with a liquid crystal display. The electronic device 500 includes a liquid crystal panel 502, a driver IC 504, a timing controller IC 506, and an image processing IC 508. The image processing IC 508 generates image data to be displayed on the liquid crystal panel 502 and transmits the image data to the timing controller IC 506. Upon receiving the image data from the image processing IC 508, the timing controller IC 506 optimizes timing for each line and each pixel for the liquid crystal panel 502 and transmits the image data to the driver IC 504. The driver IC 504 drives the liquid crystal panel 502 based on the image data from the timing controller IC 506. In this electronic device 500, a differential signal is used for exchanging data between the image processing IC 508 and the timing controller IC 506 and between the timing controller IC 506 and the driver IC 504. Thus, the differential receiver 2 according to the embodiment of the present disclosure can be mounted on a receiving interface of the driver IC 504 and a receiving interface of the timing controller IC 506.

Industrial devices 602 of FIG. 8B constitute a network system 600 formed in a relatively wide range such as a factory or the like. The network system 600 includes a plurality of industrial devices 602 and a host device 604. The industrial devices 602 and the host device 604 are based on the RS-422 and RS-485 standards and exchange data therebetween. The type of the industrial devices 602 is not particularly limited.

The differential receiver 2 according to the embodiment of the present disclosure is suitable for use with the network system 600. The host device 604 includes a differential transmitter 606. Each of the industrial devices 602 includes the differential receiver 2 according to the embodiment of the present disclosure. These differential receivers 2 and the differential transmitter 606 are connected via a common bus 608.

The present disclosure has been described in the above by way of particular embodiments. However, these embodiments are presented merely as examples, and it is to be understood by one of ordinary skill in the art that modifications to the combinations of elements and processes thereof may be made in different ways and fall within the scope of the present disclosure. Such several modifications will be described below.

While the differential receiver 2 in the present disclosure has been described by way of some examples, the differential receiver 2 may be understood as follows. The first comparator 10, the second comparator 12, and the logic gate 20 may be regarded as a window comparator for comparing the difference $\Delta V$ between the positive signal $S_{IN+}$ and the negative signal $S_{IN-}$ with the positive upper threshold voltage $V_{OFS1}$ and the negative lower threshold voltage $V_{OFS2}$. The output circuit 40 sets the output signal $S_{OUT}$ to (i) the first level (i.e., the high level) when the outputs S1 to S3 of the window comparator indicate that the difference $\Delta V$ is larger than the upper threshold voltage $V_{OFS1}$, (ii) the second level (i.e., the low level) when the outputs S1 to S3 of the window comparator indicate that the difference $\Delta V$ is smaller than the lower threshold voltage $V_{OFS2}$, and (iii) the first level (i.e., high level) when the outputs of the window comparator indicate that the condition where the difference $\Delta V$ is larger than the lower threshold voltage $V_{OFS2}$ and is smaller than the upper threshold voltage $V_{OFS1}$ is maintained for the predetermined period of time τ. Therefore, the present disclosure encompasses various modifications contained in its technical concept.

Setting of logical values of the high level and low level described in those embodiments is merely examples and may be freely changed by appropriately inverting the logical value using an inverter or the like. For example, the differential receiver 2 may set the output signal $S_{OUT}$ to the second level (i.e., the low level) if a short-circuit failure occurs. Specifically, the output circuit 40 may set the output signal $S_{OUT}$ to (i) the first level (i.e., the high level) when the first signal S1 is asserted and (ii) the second level (i.e., low level) when the second signal S2 or the third signal S3 is asserted.

According to the present disclosure in some embodiments, it is possible to provide a differential receiver which is capable of detecting failure while maintaining a wide hysteresis width or taking a wide reception margin.

While certain embodiments have been described, these embodiments have been presented by way of example only, and are not intended to limit the scope of the disclosure. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A differential receiver for receiving differential signals including a positive signal and a negative signal and generating an output signal, comprising:
    a first comparator, which has a positive offset voltage, configured to compare the positive signal and the negative signal and generate a first signal that is asserted when a difference between the positive signal and the negative signal is larger than the positive offset voltage;
    a second comparator, which has a negative offset voltage, configured to compare the positive signal and the negative signal and generate a second signal that is asserted when the difference between the positive signal and the negative signal is smaller than the negative offset voltage;
    a logic gate configured to generate a third signal that is asserted when the first signal and the second signal are negated; and
    an output circuit configured to generate the output signal based on the first to third signals, the output circuit including a filter configured to generate a fourth signal by filtering the third signal, and a logic part configured to generate the output signal based on the first signal, the second signal, and the fourth signal.

2. The differential receiver of claim 1, wherein the output circuit is configured to set the output signal to a first level when the first signal or the third signal is asserted, and a second level when the second signal is asserted.

3. The differential receiver of claim 2, wherein the output circuit is configured to set the output signal to the first level when the first signal is asserted or when a condition in which the third signal is asserted is maintained for a predetermined period of time.

4. The differential receiver of claim 1, wherein the positive signal is inputted to a non-inverted input terminal of the first comparator and the negative signal is inputted to an inverted input terminal of the first comparator,
    wherein the positive signal is inputted to a non-inverted input terminal of the second comparator and the negative signal is inputted to an inverted input terminal of the second comparator, and
    wherein the logic gate includes a first NOR gate which has a positive-logic input terminal for receiving the first signal and a negative-logic input terminal for receiving the second signal, and outputs the third signal.

5. The differential receiver of claim 4, wherein
    the filter is configured to receive the third signal and generate the fourth signal of a high level when the third signal is maintained at the high level for a predetermined period of time, and
    the logic part is configured to set the output signal to a first level when the first signal or the fourth signal is of the high level and set the output signal to a second level when the second signal is of a low level.

6. The differential receiver of claim 5, wherein the logic part includes:
    a second NOR gate which has a positive-logic input terminal for receiving the first signal and a positive-logic input terminal for receiving the fourth signal, and generates a fifth signal; and
    an SR latch which has a negative-logic set terminal for receiving the fifth signal and a negative-logic reset terminal for receiving the second signal, and outputs the output signal.

7. The differential receiver of claim 5, wherein the filter includes:
    a multi-stage delay circuit which has a plurality of delay elements connected in series, the third signal being inputted to an initial stage of the multi-stage delay circuit; and
    an AND gate which generates a logical product of the third signal and outputs of the plurality of delay elements.

8. The differential receiver of claim 7, wherein each of the delay elements includes:
    a first PMOS transistor, a first resistor, and a first NMOS transistor which are connected in series between a power line and a ground line;
    a second PMOS transistor, a second resistor, and a second NMOS transistor which are connected in series between the power line and the ground line;
    a first capacitor connected between the ground line and a connection point of the first PMOS transistor and the first resistor; and
    a second capacitor connected between the ground line and a connection point of the second resistor and the second NMOS transistor,
    wherein gates of the first PMOS transistor and the first NMOS transistor receive an input signal, and
    wherein gates of the second PMOS transistor and the second NMOS transistor are connected to the connection point of the first PMOS transistor and the first resistor.

9. The differential receiver of claim 1, wherein the positive signal is inputted to a non-inverted input terminal of the first comparator and the negative signal is inputted to an inverted input terminal of the first comparator,
    wherein the positive signal is inputted to a non-inverted input terminal of the second comparator and the negative signal is inputted to an inverted input terminal of the second comparator, and wherein the logic gate includes an AND gate which has a positive-logic first input terminal for receiving the first signal and a positive-logic second input terminal for receiving the second signal, and outputs the third signal.

10. The differential receiver of claim 9, wherein the filter is configured to receive the third signal and generate the fourth signal of a high level when the third signal is maintained at the high level for a predetermined period of time, and the logic part is configured to set the output signal to a first level when the first signal or the fourth signal is of a low level and set the output signal to a second level when the second signal is of the low level.

11. The differential receiver of claim 10, wherein the logic part includes an SR latch which has a negative-logic set terminal for receiving the first signal, a negative-logic second set terminal for receiving the fourth signal, and a negative-logic reset terminal for receiving the second signal, and outputs the output signal.

12. The differential receiver of claim 10, wherein the filter includes:

a multi-stage delay circuit which has a plurality of delay elements connected in series, the third signal being inputted to an initial stage of the multi-stage delay circuit; and a NAND gate which generates a logical product of the third signal and outputs of the plurality of delay elements.

13. The differential receiver of claim 12, wherein each of the delay elements includes:

a first PMOS transistor, a first resistor, and a first NMOS transistor which are connected in series between a power line and a ground line;

a second PMOS transistor, a second resistor, and a second NMOS transistor which are connected in series between the power line and the ground line;

a first capacitor connected between the ground line and a connection point of the first PMOS transistor and the first resistor; and a second capacitor connected between the ground line and a connection point of the second resistor and the second NMOS transistor, wherein gates of the first PMOS transistor and the first NMOS transistor receive an input signal, and wherein gates of the second PMOS transistor and the second NMOS transistor are connected to the connection point of the first PMOS transistor and the first resistor.

14. The differential receiver of claim 1, wherein each of the first comparator and the second comparator includes a differential amplifier provided at an input terminal of the comparator and the differential amplifier includes an offset resistor inserted in one side of an input differential pair of the differential amplifier.

15. The differential receiver of claim 1, wherein the output circuit is configured to set the output signal to a first level when the first signal is asserted and a second level when the second signal or the third signal is asserted.

16. The differential receiver of claim 15, wherein the output circuit is configured to set the output signal to the second level when the second signal is asserted or when a condition in which the third signal is asserted is maintained for a predetermined period of time.

17. An industrial device comprising the differential receiver of claim 1.

18. An electronic device comprising the differential receiver of claim 1.

19. A method of receiving differential signals including a positive signal and a negative signal, comprising:

by a first comparator, which has a positive offset voltage, configured to compare the positive signal and the negative signal, generating a first signal that is asserted when a difference between the positive signal and the negative signal is larger than the positive offset voltage;

by a second comparator, which has a negative offset voltage, configured to compare the positive signal and the negative signal, generating a second signal that is asserted when the difference between the positive signal and the negative signal is smaller than the negative offset voltage;

generating a third signal that is asserted when the first signal and the second signal are negated; and generating an output signal based on the first to third signals by generating a fourth signal by filtering the third signal and generating the output signal based on the first signal, the second signal, and the fourth signal.

* * * * *